United States Patent
Horng et al.

(10) Patent No.: US 12,048,116 B2
(45) Date of Patent: Jul. 23, 2024

(54) LIQUID COOLING MODULE AND ELECTRONIC DEVICE INCLUDING THE SAME

(71) Applicant: Sunonwealth Electric Machine Industry Co., Ltd., Kaohsiung (TW)

(72) Inventors: Alex Horng; Tso-Kuo Yin, Kaohsiung (TW); Ming-Tsung Li, Kaohsiung (TW)

(73) Assignee: SUNONWEALTH ELECTRIC MACHINE INDUSTRY CO., LTD., Kaohsiung (TW)

( * ) Notice: Subject to any disclaimer, the term of this patent is extended or adjusted under 35 U.S.C. 154(b) by 423 days.

(21) Appl. No.: 17/510,456

(22) Filed: Oct. 26, 2021

(65) Prior Publication Data

US 2022/0151100 A1    May 12, 2022

(30) Foreign Application Priority Data

Nov. 6, 2020 (TW) ................................ 109138862

(51) Int. Cl.
*H05K 7/20* (2006.01)
*F04D 13/06* (2006.01)
*G06F 1/20* (2006.01)

(52) U.S. Cl.
CPC ......... *H05K 7/20272* (2013.01); *F04D 13/06* (2013.01); *F04D 13/0666* (2013.01); *G06F 1/20* (2013.01)

(58) Field of Classification Search
CPC . H05K 7/20272; F04D 13/06; F04D 13/0666; G06F 1/20; H01L 23/473;
(Continued)

(56) References Cited

U.S. PATENT DOCUMENTS 4,728,268 A * 3/1988 Laing ...................... F16C 17/08
                                                            417/420
6,832,646 B1 * 12/2004 Uomori ................... G06F 1/203
                                                            361/698

(Continued)

FOREIGN PATENT DOCUMENTS

| CN | 101146429 A | 3/2008 |
| CN | 101227810 A | 7/2008 |

(Continued)

*Primary Examiner* — Bryan M Lettman
(74) *Attorney, Agent, or Firm* — WPAT, P.C

(57) ABSTRACT

A liquid cooling module includes a housing having first and second chambers filled with a working fluid and intercommunicating with each other via an intercommunicating port and a backflow port. A pump is received in the housing and is aligned with the intercommunicating port. The pump includes a stator driving an impeller to rotate, driving the working fluid to flow from the first chamber through the intercommunicating port, the stator, and the impeller. The working fluid flows through the second chamber back into the first chamber via the backflow port. An electronic device includes a casing, an electric module received in the casing and including a heat generating area, and the liquid cooling module. The liquid cooling module is disposed in the casing and is in thermal connection with the heat generating area via a heat absorbing zone of the housing aligned with the first chamber or the second chamber.

17 Claims, 11 Drawing Sheets

(58) Field of Classification Search
CPC ........... H02K 1/20; H02K 9/19; H02K 9/193; H02K 9/197
USPC .................................. 310/54; 361/699, 702
See application file for complete search history.

(56) References Cited

U.S. PATENT DOCUMENTS

| | | | |
|---|---|---|---|
| 10,136,553 B2 | 11/2018 | Jia et al. | |
| 10,667,428 B1* | 5/2020 | Kuo | ................... H05K 7/20254 |
| 2007/0035928 A1* | 2/2007 | Hamman | .................. G06F 1/20 |
| | | | 361/701 |

FOREIGN PATENT DOCUMENTS

| | | | |
|---|---|---|---|
| CN | 106061201 A | 10/2016 | |
| JP | 2008038817 A | 2/2008 | |

* cited by examiner

LIQUID COOLING MODULE AND ELECTRONIC DEVICE INCLUDING THE SAME

CROSS REFERENCE TO RELATED APPLICATION

The application claims the benefit of Taiwan application serial No. 109138862, filed on Nov. 6, 2020, and the entire contents of which are incorporated herein by reference.

BACKGROUND OF THE INVENTION

1. Field of the Invention

The present invention relates to a cooling module and an electronic device and, more particularly, to a liquid cooling module capable of maintaining an electronic device at a suitable working temperature and an electronic device including the liquid cooling module.

2. Description of the Related Art

FIG. 1 shows a conventional liquid cooling system 9 including a heat absorbing unit 91, a cooling unit 92, a pump 93, and a piping assembly 94. The heat absorbing unit 91 can abut a heat source Z of an electronic device. The piping assembly 94 includes a pipe 941 intercommunicating the pump 93 and the heat absorbing unit 91, a pipe 942 intercommunicating the pump 93 and the cooling unit 92, and a pipe 943 intercommunicating the heat absorbing unit 91 and the cooling unit 92.

According to the above structure, the pump 93 can drive a working fluid to flow in the piping assembly 94. The temperature of the working fluid flowing through the heat absorbing unit 91 rises after absorbing heat and is then reduced after passing through the cooling unit 92 which cools the working fluid. Then, the working fluid is directed to the heat absorbing unit 91 again. Through continuous circulation, the heat source Z can be maintained at a proper working temperature to avoid overheating of the electronic device.

However, the conventional liquid cooling system 9 has many components, and assembly of the components requires a certain space. Thus, it is difficult to reduce the space occupied by the whole liquid cooling system 9, which is a common issue to a thinned electronic device in spatial arrangement. Furthermore, leakage of the working fluid could occur when the piping assembly 94 of the conventional liquid cooling system 9 is not sealingly assembled with the associated components. Thus, assembly must be carried out cautiously, which is relatively troublesome and time-consuming. Furthermore, the more components of the piping assembly 94, the more likely the occurrence of leakage. Moreover, after a period of time of use, the piping assembly 94 could have problems including evaporation of working fluid, aging and breakage of pipes, etc. Thus, the piping assembly 94 has a shorter service life or requires frequent inspection and maintenance.

Thus, it is necessary to improve the conventional liquid cooling system.

SUMMARY OF THE INVENTION

To solve the above problems, it is an objective of the present invention to provide a liquid cooling module with fewer components while reducing the space required for assembly of the components, which is more suitable for use in thinned electronic devices.

It is another objective of the present invention to provide a liquid cooling module whose working fluid scarcely leaks or evaporates, avoiding gradual reduction in the amount of the working fluid.

It is a further objective of the present invention to provide a liquid cooling module which can be pre-assembled to permit subsequent rapid assembly to a pre-determined location of an electronic device.

It is still another objective of the present invention to provide a liquid cooling module having a large heat absorbing area and a large cooling area while maintaining excellent circulating efficiency of the working fluid, thereby effectively reducing the working temperature of the heat source.

It is yet another objective of the present invention to provide an electronic device including the above-mentioned liquid cooling module.

As used herein, the term "a", "an" or "one" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

As used herein, the term "coupling", "engagement", "assembly", or similar terms is used to include separation of connected members without destroying the members after connection or inseparable connection of the members after connection. A person having ordinary skill in the art would be able to select according to desired demands in the material or assembly of the members to be connected.

A liquid cooling module according to the present invention includes a housing and a pump. The housing includes a first chamber and a second chamber. The first chamber and the second chamber are filled with a working fluid. The first chamber and the second chamber intercommunicate with each other via an intercommunicating port and a backflow port. The pump is received in the housing and is aligned with the intercommunicating port. The pump includes a stator driving an impeller to rotate, driving the working fluid to flow from the first chamber through the intercommunicating port, the stator, and the impeller. The working fluid flows through the second chamber back into the first chamber via the backflow port.

An electronic device according to the present invention includes a casing, an electric module received in the casing and including a heat generating area, and the above liquid cooling module. The liquid cooling module is disposed in the casing and is in thermal connection with the heat generating area via a heat absorbing zone of the housing aligned with the first chamber or the second chamber.

Thus, in the liquid cooling module according to the present invention, the first and second chambers arranged in different layers in the axial direction and intercommunicating with each other can be directly formed in the housing, permitting the working fluid to proceed with large-area circulation, enlarging the heat absorbing area and the cooling area while maintaining excellent circulating efficiency of the working fluid, thereby increasing the cooling efficiency to highly effectively reducing the working temperature of the heat source. Furthermore, the number of components of the liquid cooling module is fewer to reduce the space required for assembly of the components while reliably avoiding leakage of the working fluid resulting from non-sealing assembly between the components. Moreover, the problem of gradual reduction in the amount of working liquid resulting from evaporation is less likely to occur, because the working liquid is not delivered by pipes. In addition, the liquid cooling module can be pre-assembled for subsequent rapid assembly to a pre-determined location of an electronic device. Thus, the liquid cooling module according to the present invention provides increased spatial utilization rate and increased assembly efficiency, which is helpful in development of thinning of electronic devices with the liquid cooling module.

In an example, the housing includes a first board, a second board, and a partitioning board between the first board and the second board. The first chamber is located between the first board and the partitioning board. The second chamber is located between the second board and the partitioning board. The intercommunicating port and the backflow port are disposed on the partitioning board. Thus, the housing is easy to manufacture and can effectively avoid leakage of the working fluid, increasing the manufacturing convenience and the anti-leakage effect.

In an example, the partitioning board includes a first face and a second face opposite to the first face. The first board is coupled to the first face of the partitioning board by laser welding. The second board is coupled to the second face of the partitioning board by laser welding. Thus, the boards can be sealingly coupled together without gaps, increasing the sealing effect and the structural strength of the housing.

In an example, the second board includes a bulge, and the pump is at least partially received in the bulge. Thus, other portions of the housing can be more thinned for application in thinned electronic devices.

In an example, the bulge is integrally formed with remaining portion of the second board. Thus, an anti-leakage effect is provided.

In an example, the second board includes a through-hole. A cap is coupled to the second board and is aligned with the through-hole. The cap forms the bulge of the second board. Thus, the housing is easy to manufacture and assemble. When the specification of the pump changes, only a change of the mold for forming the cap is required. The mold for forming the second board is still applicable, increasing the manufacturing convenience and reducing the costs.

In an example, the pump is coupled to the partitioning board by the stator. A portion of the stator surrounding the intercommunicating port forms a liquid inlet of the pump. A shaft coupling portion is disposed in the bulge. The impeller is rotatably coupled to the shaft coupling portion. Thus, the pump has a simpler structure to assist in reduction in the thickness and weight of the overall liquid cooling module, which is suitable for even thinner electronic devices.

In an example, the pump includes a seat. The seat is coupled to the partitioning board by an annular wall and forms a liquid inlet of the pump at a location contiguous to the intercommunicating port. The pump has a liquid outlet disposed on the annular wall. Thus, the working fluid passing through the intercommunicating port can entirely flow through the liquid inlet into the seat, increasing the flow efficiency of the working fluid driven by the pump.

In an example, the annular wall is coupled to the partitioning board by laser welding. Thus, the sealing effect between the annular wall and the partitioning board is improved.

In an example, the stator includes a winding portion disposed on an inner periphery of an outer ring. The outer ring is coupled to the seat. The impeller includes a plurality of blades surrounding a hub. A magnetic member is disposed on the hub. The seat includes a bottom board connected to the annular wall. The liquid inlet of the pump is aligned with the bottom board. A shaft coupling portion is disposed on the bottom board and is located in the seat. The hub is rotatably coupled to the shaft coupling portion. The magnetic member is aligned with the winding portion. Thus, the pump can fully use the space surrounding the stator to induce flow, such that the volume of the pump can be reduced while fulfilling the expected flow and lift, which is helpful in development of thinning of the liquid cooling module.

In an example, the liquid outlet of the pump faces away from the backflow port. The housing includes an island located in the second chamber. The island is contiguous to the intercommunicating port and extends towards the backflow port. Thus, the working fluid can be more uniformly and smoothly guided into all fluid passages, enlarging the cooling area or the heat absorbing area.

In an example, a diameter of the liquid inlet is larger or equal to the minimal inner diameter of the stator and is smaller than or equal to an outer diameter of the annular wall. Thus, the pump can have a larger liquid inlet, increasing the inflow.

In an example, the housing includes a plurality of ribs spaced from each other and located in the first chamber and the second chamber. A fluid passage is formed between each two adjacent ribs. Thus, the working fluid can be guided to flow more uniformly and smoothly in the first chamber or the second chamber.

In an example, the plurality of ribs does not extend to a portion of the first chamber surrounding the intercommunicating port and a portion of the second chamber surrounding the intercommunicating port. Thus, the working fluid can be gathered at a location adjacent to the intercommunicating port to pass through the intercommunicating port more smoothly, increasing the flow efficiency of the working fluid driven by the pump.

In an example, the stator and the impeller are disposed on the same side of the partitioning board. Thus, the other side of the partitioning board can be further thinned, which is helpful in development of thinning of the housing.

In an example, the first chamber and the second chamber of the housing are formed by etching, increasing the yield of formation and assisting in thinning development.

In an example, the working fluid is an electrically non-conductive liquid. Thus, the stator of the pump does not require additional waterproof structure, simplifying the structure of the liquid cooling module to thereby increase the manufacturing convenience.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
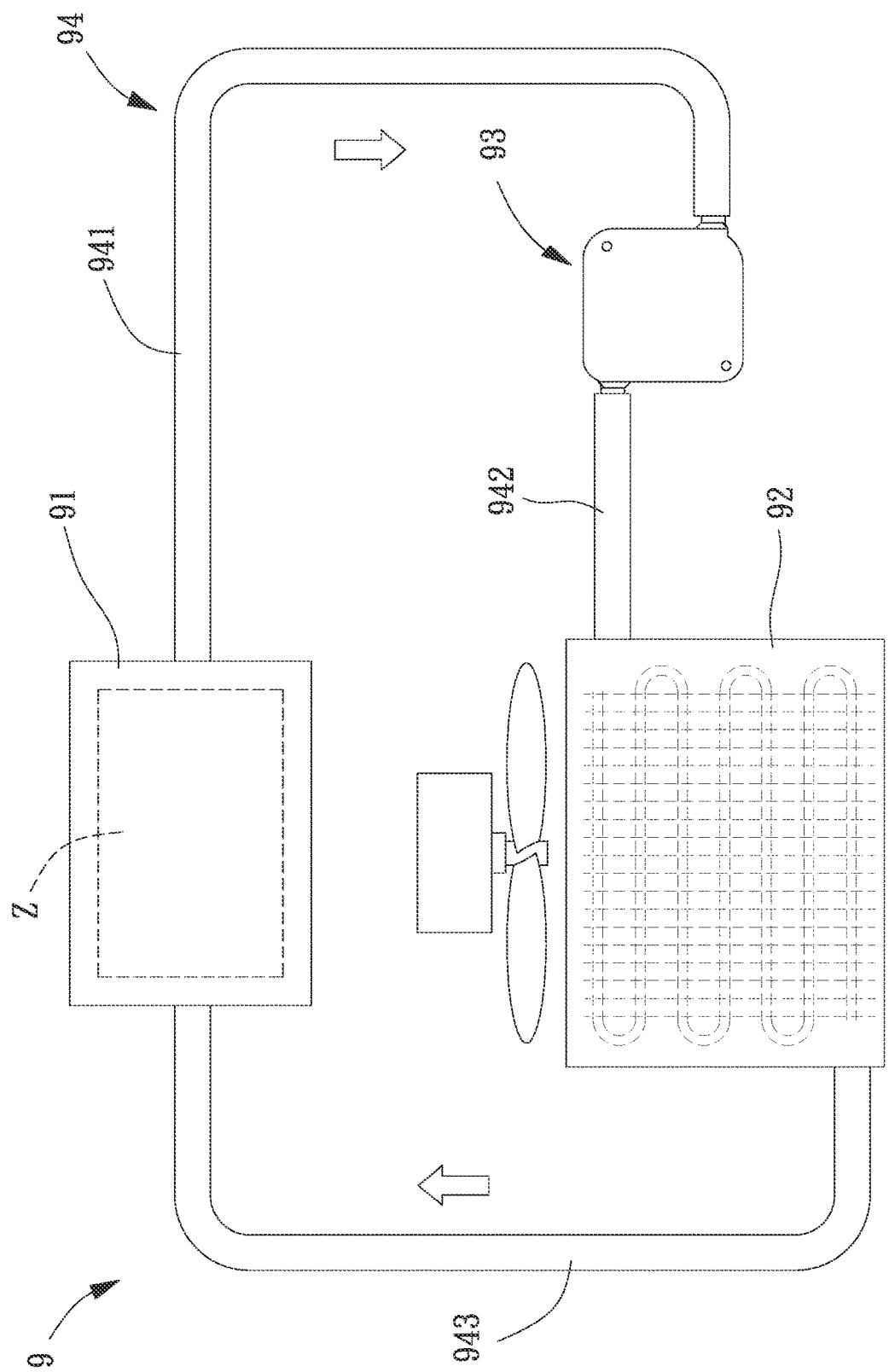
FIG. 1 is a diagrammatic view of a conventional liquid cooling system.

In the various figures of the drawings, the same numerals designate the same or similar parts. Furthermore, when the terms "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

Figure 2:
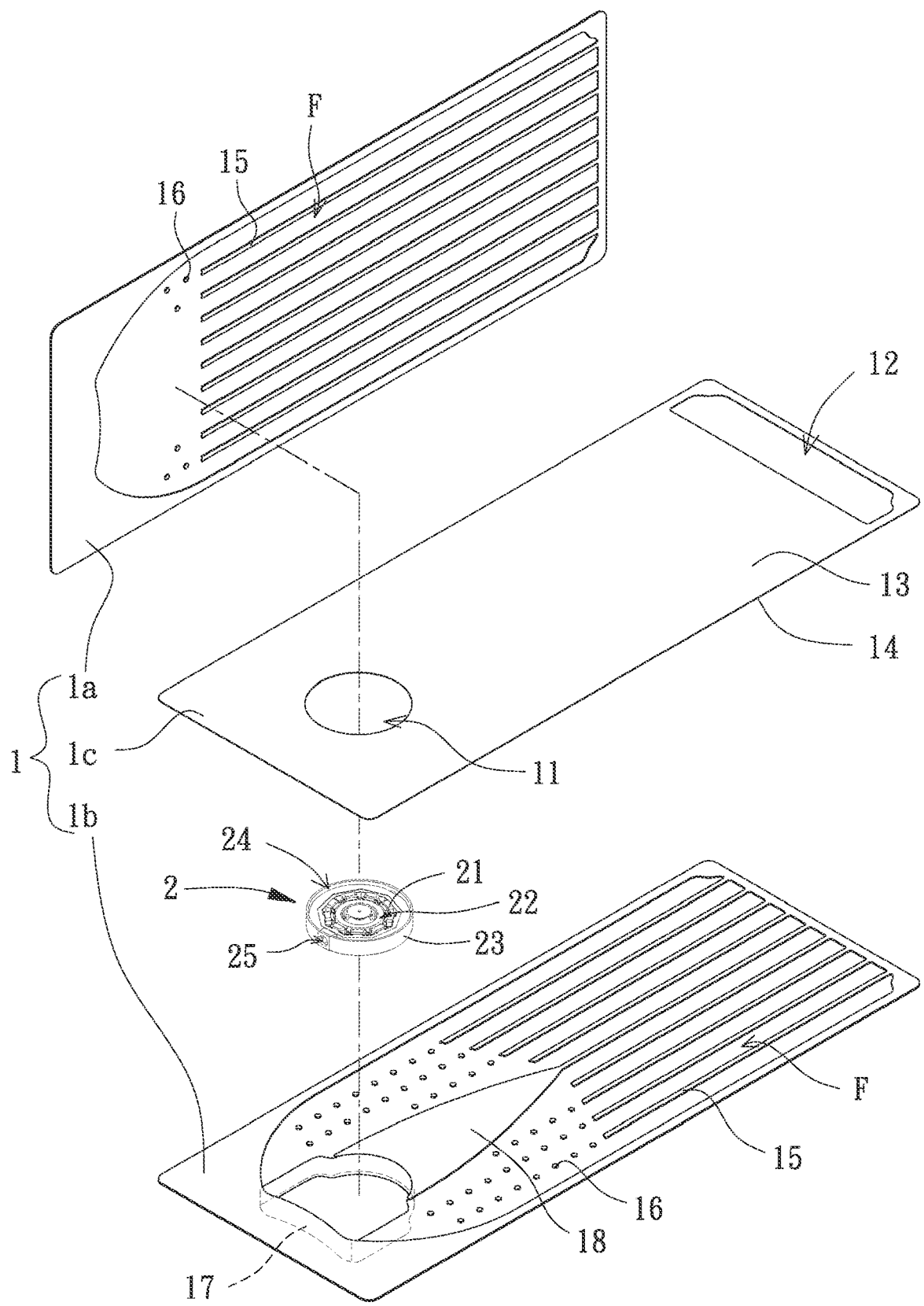
FIG. 2 is an exploded, perspective view of a liquid cooling module of a first embodiment according to the present invention.
Figure 6:
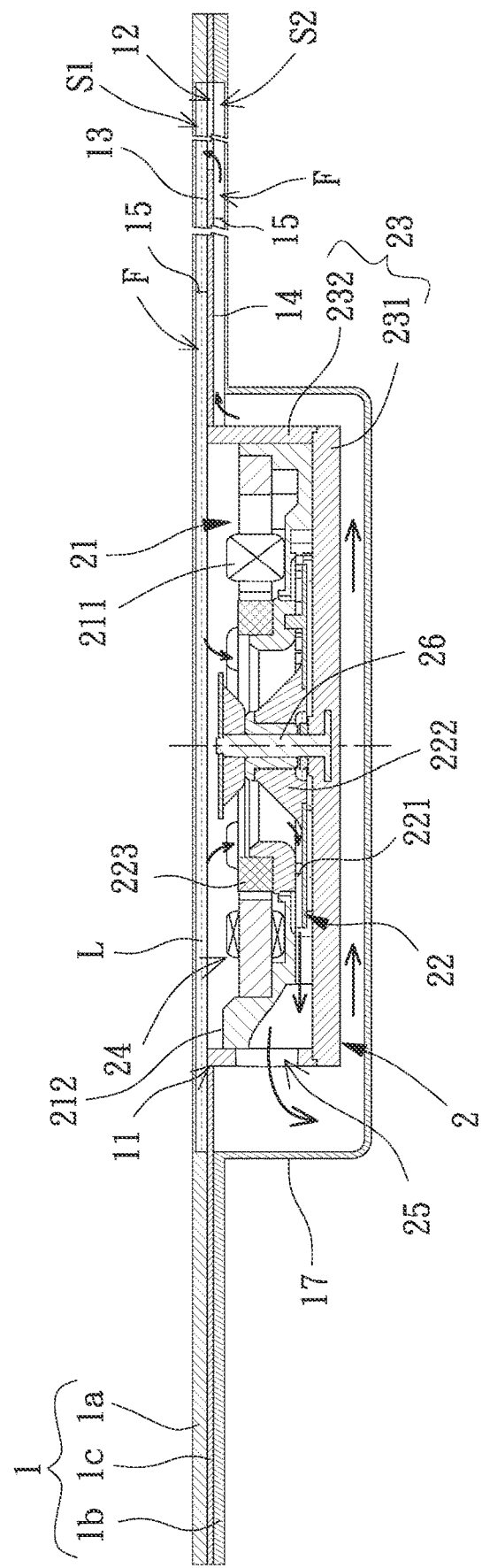
FIG. 6 is a cross sectional view taken along section line 6-6 of FIG. 5 with an island of a housing omitted.

With reference to FIGS. 2 and 6, a liquid cooling module of a first embodiment according to the present invention includes a housing 1 and a pump 2. The pump 2 is received in the housing 1 and can be used to drive a working fluid L to circulate in the housing 1.

The housing 1 can be made of copper, aluminum, titanium, stainless steel or other thermally conductive material. The housing 1 includes first and second chambers S1 and S2 therein. The first chamber S1 and the second chamber S2 are filled with the working fluid L and intercommunicate with each other via an intercommunicating port 11 and a backflow port 12. Thus, operation of the pump 2 drives the working fluid L to flow from the first chamber S1 through the intercommunicating port 11 into the second chamber S2. Then, the working fluid L flows through the backflow port 12 back into the first chamber S1. Thus, the working fluid L can circulate in the first chamber S1 and the second chamber S2 or circulate in a reverse direction.

Specifically, the housing 1 can include a first board 1a, a second board 1b, and a partitioning board 1c between the first board 1a and the second board 1b. The partitioning board 1c includes a first face 13 and a second face 14 opposite to the first face 13. The first board 1a faces the first face 13 of the partitioning board 1c, such that the first chamber S1 is located between the first board 1a and the partitioning board 1c. The second board 1b faces the second face 14 of the partitioning board 1c, such that the second chamber S2 is located between the second board 1b and the partitioning board 1c. The intercommunicating port 11 and the backflow port 12 can be optionally disposed on the partitioning board 1c and extend from the first face 13 through the second face 14.

The housing 1 can optionally include a recessed portion in at least one of two mutually-facing faces respectively of the first board 1a and the partitioning board 1c, such that the first board 1a and the partitioning board 1c together form the first chamber S1. Likewise, the housing 1 can optionally include a recessed portion in at least one of two mutually-facing faces respectively of the second board 1b and the partitioning board 1c, such that the second board 1b and the partitioning board 1c together form the second chamber S2. The first board 1a and the second board 1b can be separately coupled with the partitioning board 1c. Alternatively, the first board 1a can be coupled with the second board 1b. The present invention is not limited to the type of coupling, as long as the first chamber S1 and the second chamber S2 are separated by the partitioning board 1c, and the first and second chambers S1 and S2 are sealed in the housing 1 to avoid leakage of the working fluid L. Furthermore, the present invention is not limited to the coupling between the boards, which can be carried out by gluing, insertion, clamping, screwing, and welding. In this embodiment, adjacent boards are coupled by laser welding to assure sealed coupling between the boards without gaps, improving the sealing effect and increasing the structural strength of the housing 1.

To permit easy manufacture and assembly, this embodiment can use the first board 1a, the second board 1b, and the partitioning board 1c in the form of sheets, with the partitioning board 1c being planar. Furthermore, etching processes are carried out on the face of the first board 1a facing the partitioning board 1c and the face of the second board 1b facing the partitioning board 1c, such that the first board 1a and the second board 1b are partially thinned to form recesses. Thus, after the first board 1a is coupled to the first face 13 of the partitioning board 1c and the second board 1b is coupled to the second face 14 of the partitioning board 1c, an extremely thin housing 1 with the first and second chambers S1 and S2 can be formed (the thickness of the housing 1, excluding the portion for mounting the pump 2, can be smaller than or equal to 3 mm), which is suitable for thinned electronic devices.

The housing 1 may include a plurality of ribs 15 spaced from each other and located in the first chamber S1 and the second chamber S2. The ribs 15 in the same chamber are substantially parallel to each other and substantially extend in a connecting direction between the intercommunicating port 11 and the backflow port 12 (i.e., the flowing direction of the working fluid L), such that a fluid passage F is formed between each two adjacent ribs 15, which is helpful in guiding the working fluid L to flow more uniformly and smoothly in the first chamber S1 or the second chamber S2. The plurality of ribs 15 does not extend to a portion of the first chamber S1 surrounding the intercommunicating port 11 and a portion of the second chamber S2 surrounding the intercommunicating port 11. This permits the working fluid L to gather at a location adjacent to the intercommunicating port 11 and to flow through the intercommunicating port 11 more smoothly, increasing the flow efficiency of the working fluid L driven by the pump 2. The housing 1 may further includes a plurality of posts 16 located in the first chamber S1 and the second chamber S2 and essentially not located in the area with the plurality of ribs 15. The heights of the plurality of posts 16 and the plurality of ribs 15 can be approximately the same as the depth of the first chamber S1 or the second chamber S2 (excluding the portion on which the pump 2 is mounted). Thus, the plurality of posts 16 and the plurality of ribs 15 abut the partitioning board 1c to provide an auxiliary supporting effect. This is helpful in maintaining the first chamber S1 or the second chamber S2 in a substantially fixed volume, avoiding partial deformation of the housing 1.

On the other hand, regarding the portion of the housing 1 where the pump 2 is mounted, in a case that the axial height of the pump 2 is larger than the thickness of the remaining portion of the housing 1, a portion of the first board 1 and/or a portion of the second board 1b can form a bulge 17 for receiving the pump 2, such that the pump 2 is aligned with the intercommunicating port 11 and is received in the first chamber S1 or the second chamber S2 or in both the first chamber S1 and the second chamber S2. In an example in which the bulge 17 is disposed on the second board 1b, the bulge 17 can be integrally formed with the remaining portion of the second board 1b to avoid leakage of liquid, such as forming the bulge 17 by pressing.

The pump 2 is received in the housing 1 and includes a stator 21 for driving an impeller 22 to rotate, driving the working fluid L to circulate in the first chamber S1 and the second chamber S2. In this embodiment, the pump is a centrifugal pump with an axial input and a lateral output and is aligned with the intercommunicating port 11, such that the working fluid L can flow from the first chamber S1 through the intercommunicating port 11, the stator 21, and the impeller 22 (including sequentially or non-sequentially flowing through the intercommunicating port 11, the stator 21, and the impeller 22). Then, the working fluid L flows from the second chamber S2 back into the first chamber S1 via the backflow port 12. The stator 21 and the impeller 22 can be optionally located on the same side of the partitioning board 1c, such as located in the second chamber S2 without extending into the first chamber S1, such that the other side can be thinner.

Figure 3:
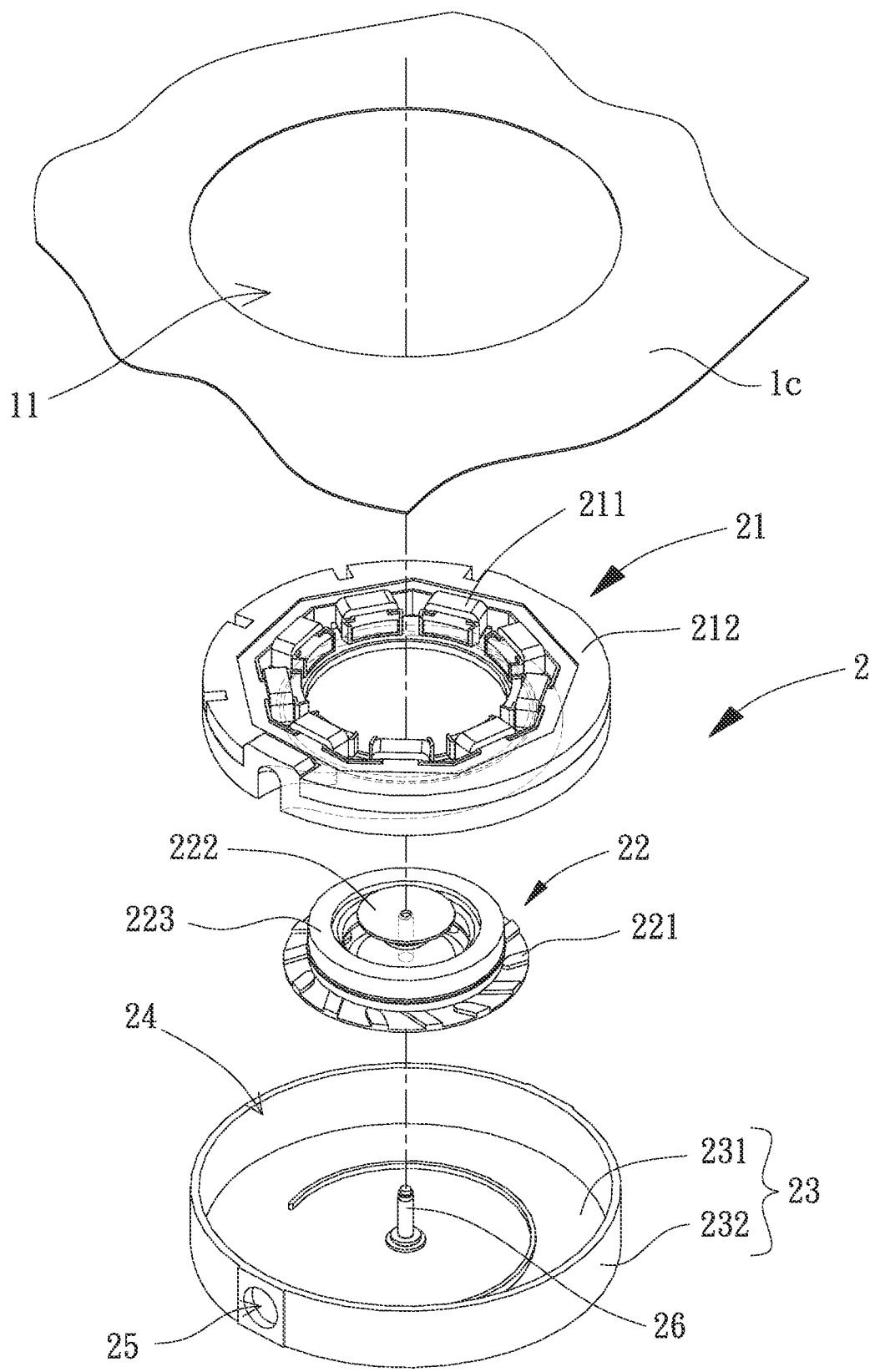
FIG. 3 is a partial, exploded, perspective view of a partitioning board and a pump of the liquid cooling module of the first embodiment according to the present invention.

More specifically, with reference to FIGS. 3 and 6, the stator 21 includes a winding portion 211 disposed on an inner periphery of an outer ring 212. The impeller 22 includes a plurality of blades 221 surrounding a hub 222. A magnetic member 223 may be directly or indirectly disposed on the hub 222. In this embodiment, the pump 2 can further include a seat 23 having a bottom board 231 connected to an annular wall 232. In assembly, the outer ring 212 of the stator 21 can be coupled to the bottom board 231 and/or the annular wall 232 of the seat 23. The seat 23 can be sealingly coupled to the partitioning board 1c by the annular wall 232, forming a liquid inlet 24 of the pump 2 at a location contiguous to the intercommunicating port 11. The liquid inlet 24 of the pump 2 is approximately aligned with the bottom board 231 in the axial direction. The pump 2 has a liquid outlet 25 that can be disposed on the annular wall 232 of the seat 23. The pump 2 may further include a shaft coupling portion 26 disposed on the bottom board 231 and located in the seat 23. Thus, the hub 222 of the impeller 22 can be rotatably coupled to the shaft coupling portion 26, and the magnetic member 223 is aligned with the winding portion 211 in a radial direction.

In the pump 2 of this embodiment, the winding portion 211 is closer to the intercommunicating port 11 than the plurality of blades 221 is. Thus, when the pump 2 operates, the working fluid L passing through the intercommunicating port 11 entirely flows into the seat 23 via the liquid inlet 24, flows through the stator 21 and then the impeller 22, and finally flows out of the seat 23 via the liquid outlet 25. Preferably, the working fluid L is an electrically non-conductive liquid, such that the stator 21 of the pump 2 does not require additional waterproof structure. Furthermore, the annular wall 232 of the seat 23 can be optionally coupled to the partitioning board 1c by laser welding, such that the sealing effect therebetween is excellent and that no gaps exist therebetween. This assures the working fluid L at the intercommunicating port 11 can entirely flow through the pump 2, increasing the flow efficiency of the working fluid L driven by the pump.

Figure 4:
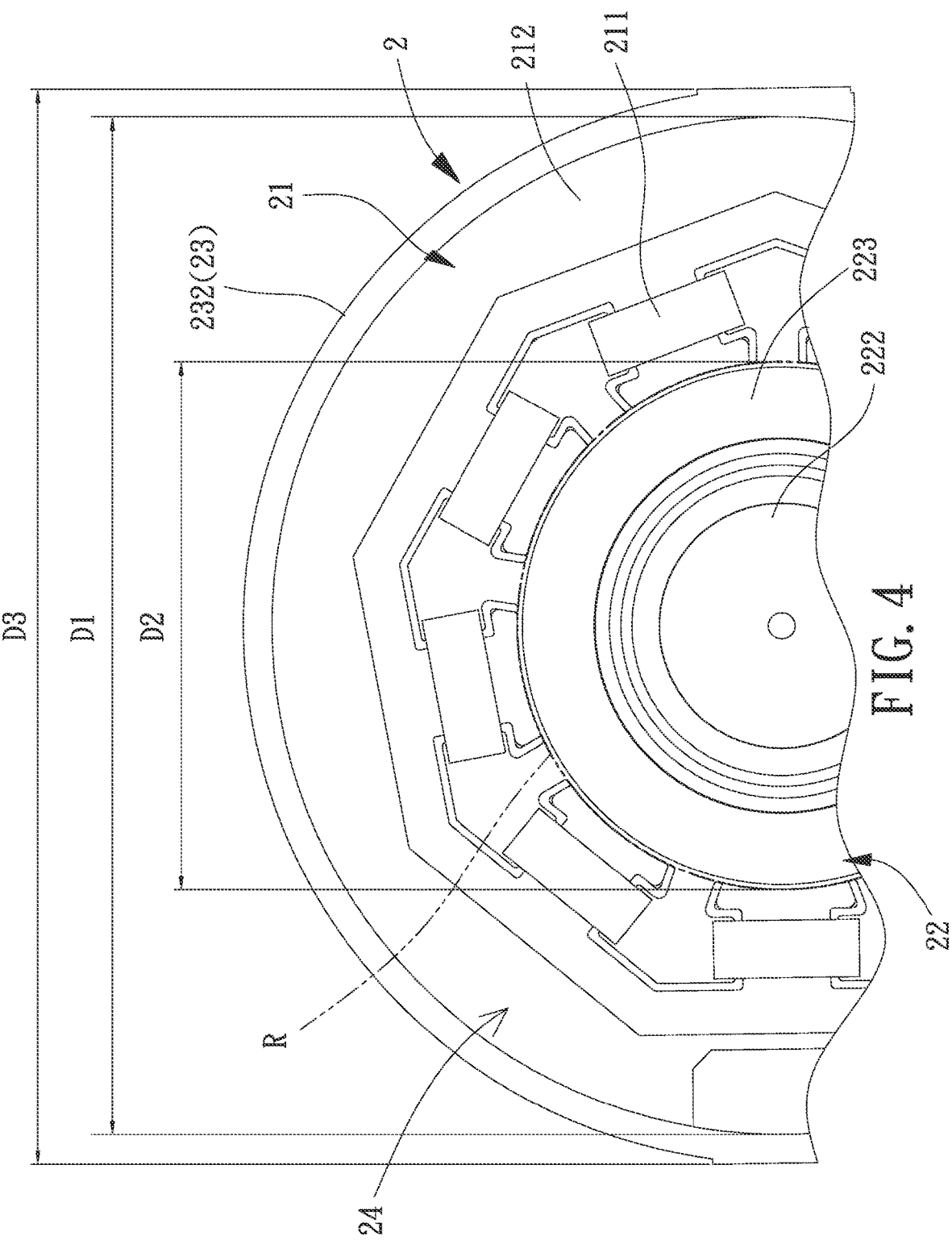
FIG. 4 is a partial, front elevational view of the pump of the liquid cooling module of the first embodiment according to the present invention.

With reference to FIGS. 4 and 6, the diameter D1 of the liquid inlet 24 can be larger than or equal to the minimal inner diameter D2 of the stator 21 (in this embodiment, the minimal inner diameter D2 of the stator 21 is the diameter of an imaginary circle R passing through each pole face) and can be smaller than or equal to an outer diameter D3 of the annular wall 232, such that the pump 2 can have a larger liquid input 24 to increase the inflow. In this embodiment, since the seat 23 is optionally coupled to a periphery of the intercommunicating port 11 by the outer periphery of the annular wall 232, the liquid inlet 24 can be formed at the inner periphery of the annular wall 232, such that the diameter D1 of the liquid inlet 24 is slightly smaller than the outer diameter D3 of the annular wall 232. However, the present invention is not limited in this regard. In an alternative embodiment, in a case that the thickness of the annular wall 232 varies, the diameter D1 of the liquid inlet 24 is also slightly smaller than the outer diameter D3 of the annular wall 232. In another case that a top edge of the annular wall 232 includes an inclined surface or a curved surface connecting an inner periphery and an outer periphery of the annular wall 232, the diameter D1 of the liquid inlet 24 may be approximately equal to the outer diameter D3 of the annular wall 232.

Figure 5:
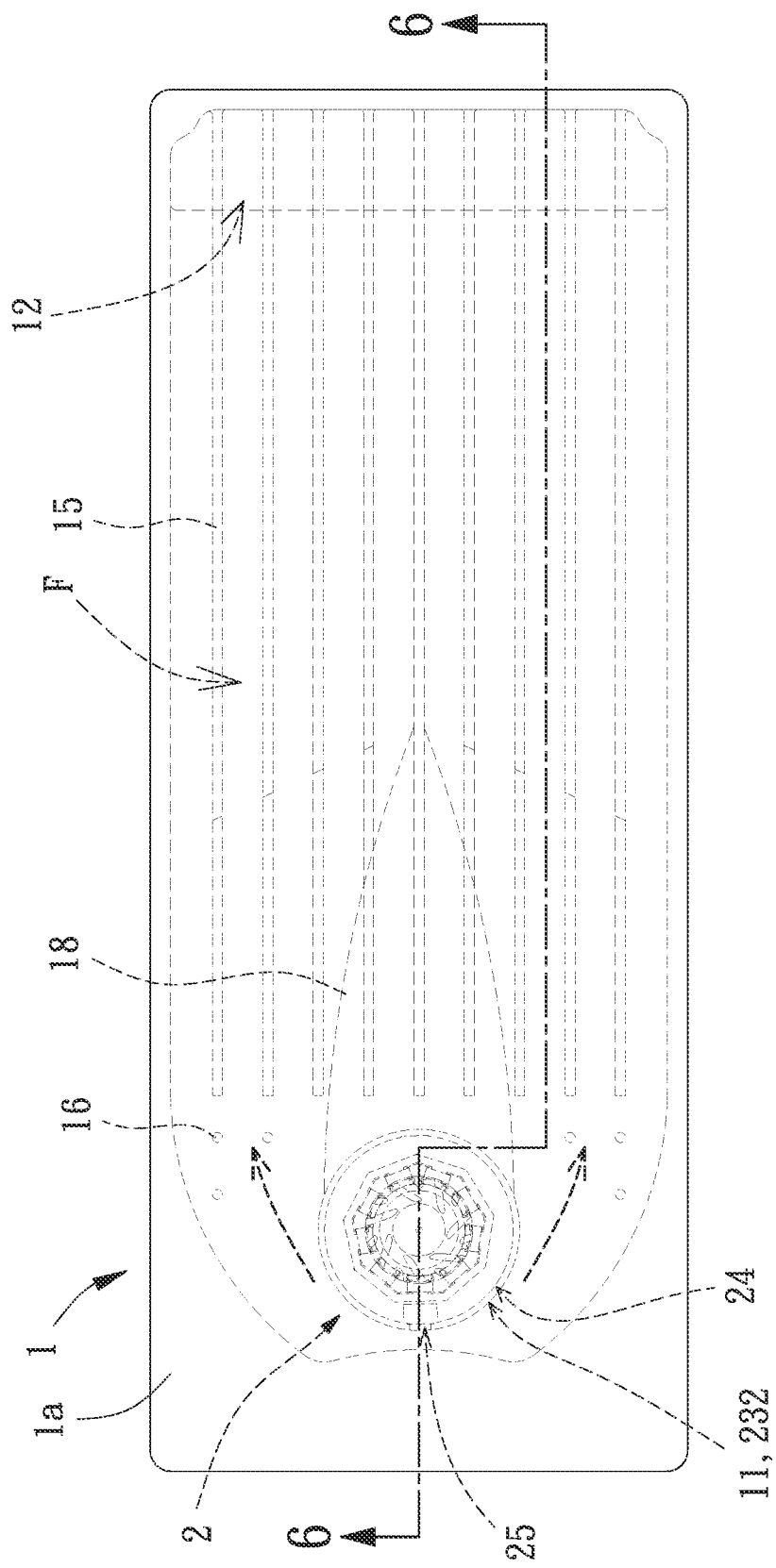
FIG. 5 is a front elevational view of the liquid cooling module of the first embodiment according to the present invention after assembly.

Furthermore, with reference to FIGS. 2 and 6 again, an end of the second chamber S2 adjacent to the intercommunicating port 11 is referred to as a head end, whereas another end of the second chamber S2 adjacent to the backflow port 12 is referred to as a tail end. In this embodiment, the liquid outlet 25 of the pump 2 may optionally face the head end of the second chamber S2 (namely, face away from the backflow port 12). Furthermore, the housing 1 may include an island 18 located in the second chamber S2. The island 18 can be contiguous to the intercommunicating port 11 and can extend towards the backflow port 12, such as extending to connect with the rib 15 located in a central location of the second chamber S2. Thus, in comparison with the case in which the working fluid L can only flow into fewer fluid passages F directly facing the liquid outlet 25 due to an arrangement of the liquid outlet 25 of the pump 2 directly facing the fluid passages F, the disposition of the this embodiment (see also FIG. 5) permits the working fluid L flowing out of the liquid outlet 25 to firstly rush to an inner wall of the cap P and then be divided into two streams which are guided by the island 18 to be more uniformly and smoothly guided into all fluid passages F. The working fluid L flows along the fluid passages F towards the backflow port 12, thereby enlarging the cooling area or the heat absorbing area.

Figure 7:
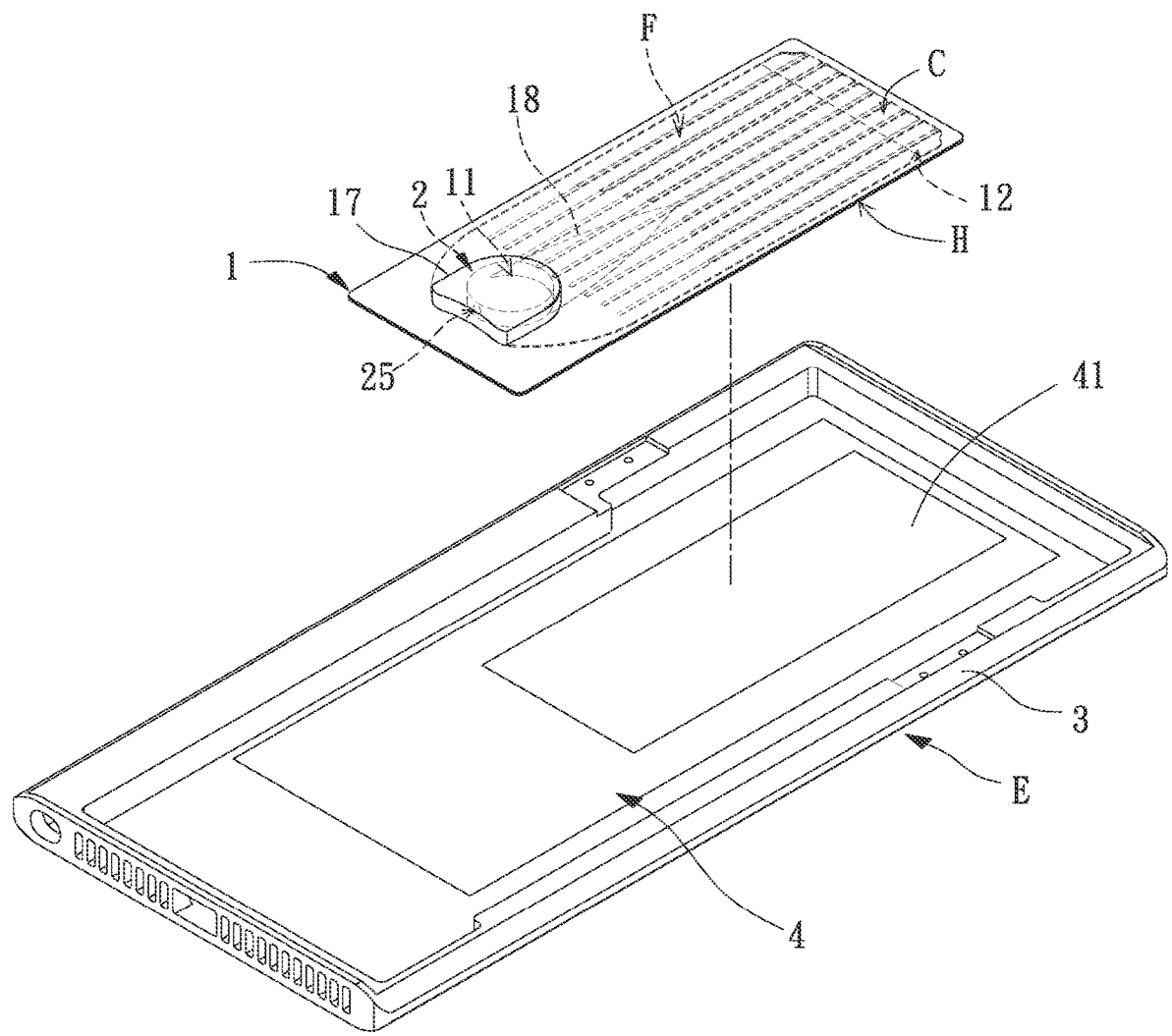
FIG. 7 is a perspective view of the liquid cooling module of the first embodiment disassembled from an electronic device according to the present invention.

With reference to FIGS. 6 and 7, after assembly, the liquid cooling module can be placed into a casing 3 of an electronic device E. An electronic module 4 is received in the casing 3 and includes a heat generating area 41. The housing 1 includes a heat absorbing zone H and a cooling zone C. The heat absorbing zone H is aligned with the first chamber S1 and the cooling zone C is aligned with the second chamber S2. A reverse arrangement can be provided. Namely, a face of the housing 1 is the heat absorbing zone H, and the other face of the housing 1 is the cooling zone C. Furthermore, the housing 1 can be in thermal connection with the heat generating area 41 of the electric module 4 by the heat absorbing zone H, such as direct contact or indirect contact via a thermally conductive material, such as a thermal pad. Thus, during operation of the electronic device E, when the temperature of the heat generating area 41 rises, the housing 1 absorbs the heat of the heat generating area 41, such that the temperature of the working fluid L flowing through the heat absorbing zone H increases due to absorption of heat. Then, when flowing through the cooling zone C, the working fluid L comes into contact with a portion of the housing 1 of a lower temperature, thereby releasing the heat and reducing the temperature. Thus, the liquid cooling module can effectively carry away the heat of the heat generating area 41 through continuous circulation of the working fluid L in the first chamber S1 and the second chamber S2, assisting in cooling the electric module 4 to maintain at a proper working temperature.

The casing 3 can be entirely or partially made of metal, and the cooling zone C of the housing 1 contacts the metal portion of the casing 3, permitting rapid heat exchange with the outside. Alternatively, a cooling fan unit can be disposed in the casing 3 to drive air to flow through the cooling zone C of the housing 1, or a heat sink assembly is connected to the cooling zone C of the housing 1, or both the cooling fan unit and the heat sink assembly are disposed, all of which are helpful in rapidly lowering the temperature of the working fluid L passing through the cooling zone C. Furthermore, the electronic device E to which the liquid cooling module is applicable can be, but not limited to, a mobile phone, a tablet, a handheld game console, a notebook computer, a desktop computer, a photographing device, a smart wearable device, AR/VR glasses, or electronic medical equipment.

Figure 8:
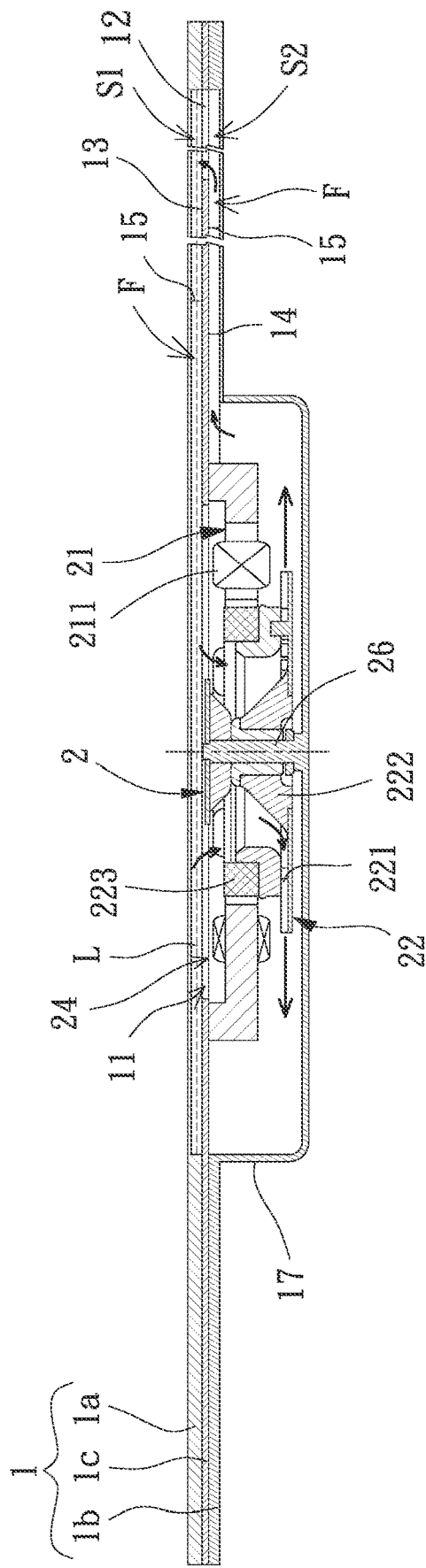
FIG. 8 is a cross sectional view of a liquid cooling module of a second embodiment according to the present invention.

FIG. 8 shows a liquid cooling module of a second embodiment according to the present invention. In this embodiment, the pump 2 may optionally exclude the seat 23 (shown in FIG. 6) for further simplification of the pump 2.

More specifically, the pump 2 of this embodiment may optionally be directly coupled to the partitioning board 1c by the stator 21, and a portion of the stator 21 surrounding the intercommunicating port 11 forms the liquid inlet 24 of the pump 2. Furthermore, the shaft coupling portion 26 of the pump 2 can be directly disposed in the bulge 17 of the housing 1. The impeller 22 is rotatably coupled to the shaft coupling portion 26. Thus, the working fluid L flowing from the first chamber S1 through the intercommunicating port 11 can entirely pass through the liquid inlet 24 and flow through the stator 21 and the impeller 22 into the fluid passages F in the second chamber S2 (see also FIG. 2). The pump 2 of this embodiment has a simpler structure to assist in reduction of the overall thickness of the liquid cooling module.

Figure 9:
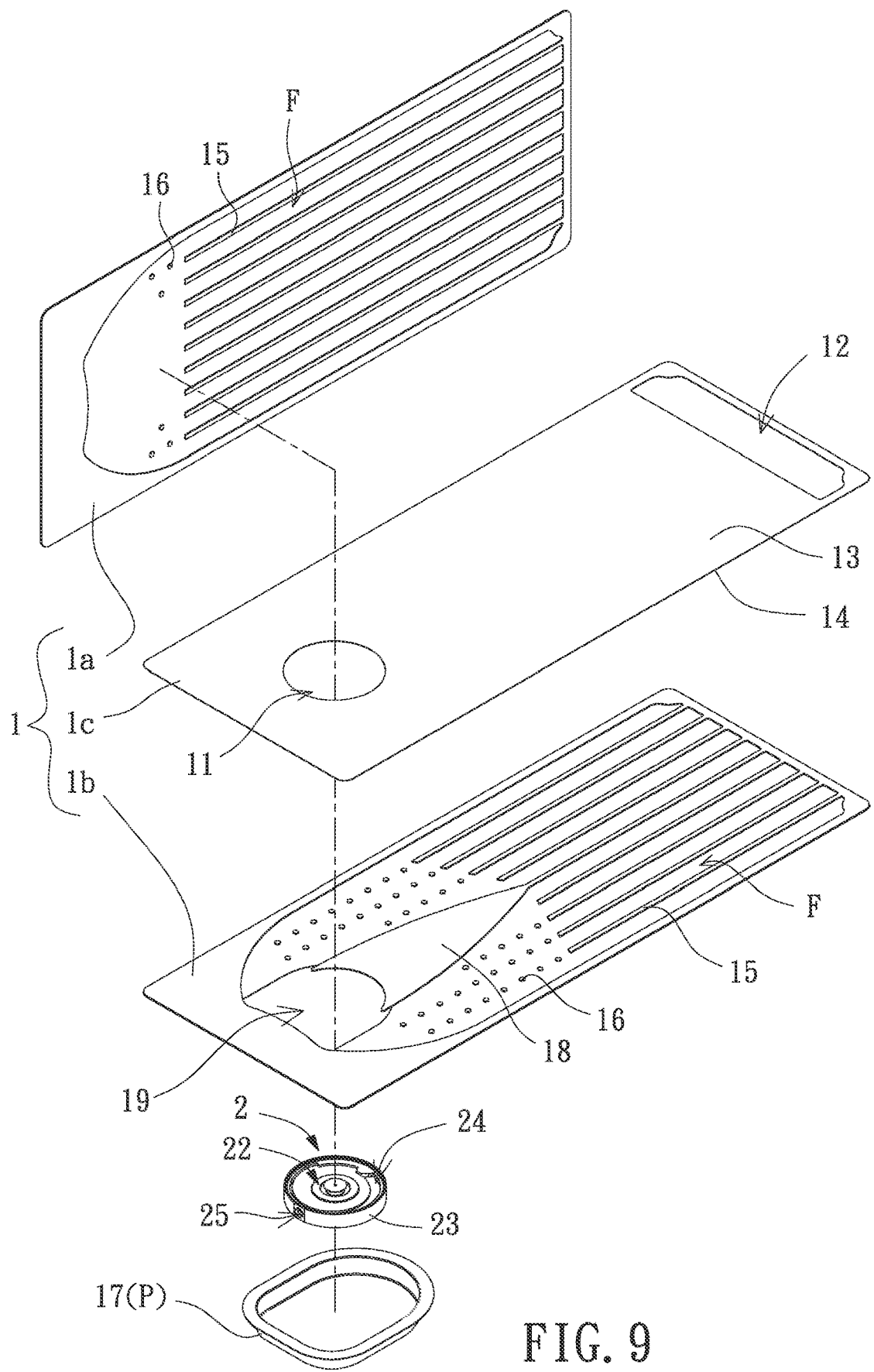
FIG. 9 is an exploded, perspective view of a liquid cooling module of a third embodiment according to the present invention.
Figure 10:
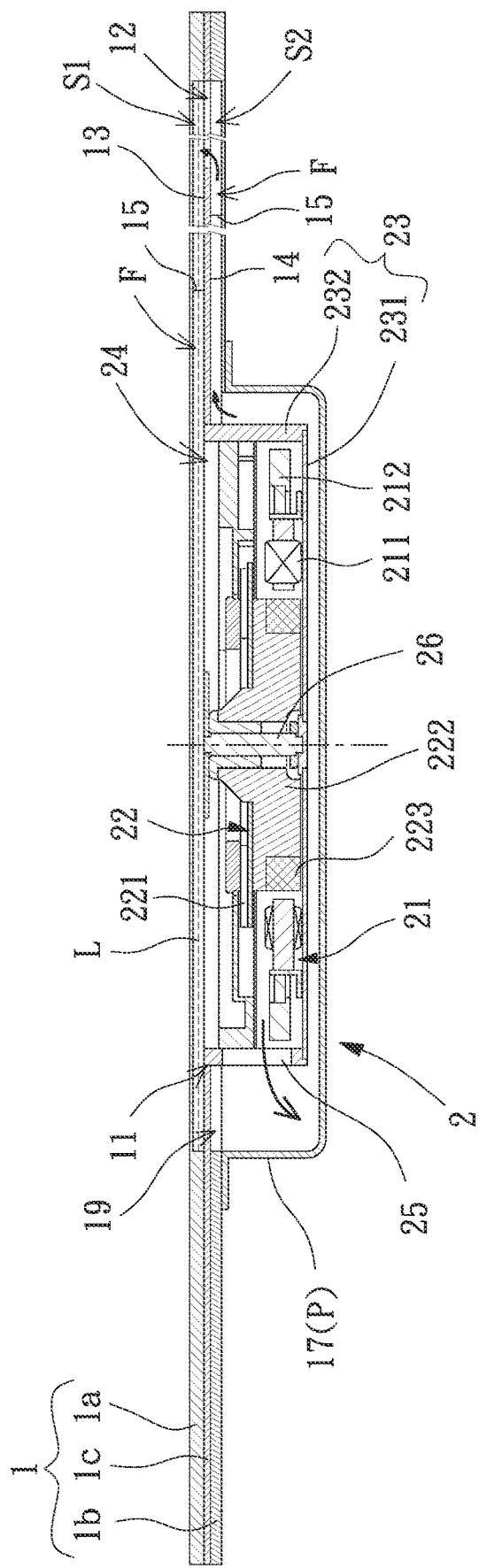
FIG. 10 is a cross sectional view of the liquid cooling module of the third embodiment according to the present invention.

FIGS. 9 and 10 show a liquid cooling module of a third embodiment according to the present invention. In this embodiment, the bulge 17 of the second board 1b may optionally be formed by assembly, providing a pump 2 of another type.

More specifically, in this embodiment, a through-hole 19 is provided on the second board 1b in the form of a sheet. Furthermore, a cap P is coupled to an outer face of the second board 1b and is aligned with the through-hole 19, such that the cap P forms the bulge 17 of the second board 1b. Thus, at least a portion of the pump 2 is received in the bulge 17. As a result, when the specification of the pump 2 changes, only a change of the mold for forming the cap P is required. The mold for forming the second board 1b is still applicable, reducing the mold costs at the manufacturing end. The cap P may optionally be coupled to the second board 1b by laser welding, such that the sealing effect therebetween is excellent and that no gaps exist therebetween. The risk of liquid leakage at this location is reduced.

Furthermore, the type of the stator 21 and the impeller 22 of the pump 2 of this embodiment can be changed, such that the plurality of blades 221 of the impeller 22 is closer to the intercommunicating port 11 than the winding portion 211 of the stator 21 is. Thus, when the pump 2 of this embodiment operates, the working fluid L passing through the intercommunicating port 11 can entirely flow into the seat 23 via the liquid inlet 24, can flow through the impeller 22 and then the stator 21, and can finally flow out of the seat 23 via the liquid outlet 25, achieving the same effect of driving the working fluid L to circulate in the first chamber S1 and the second chamber S2.

Figure 11:
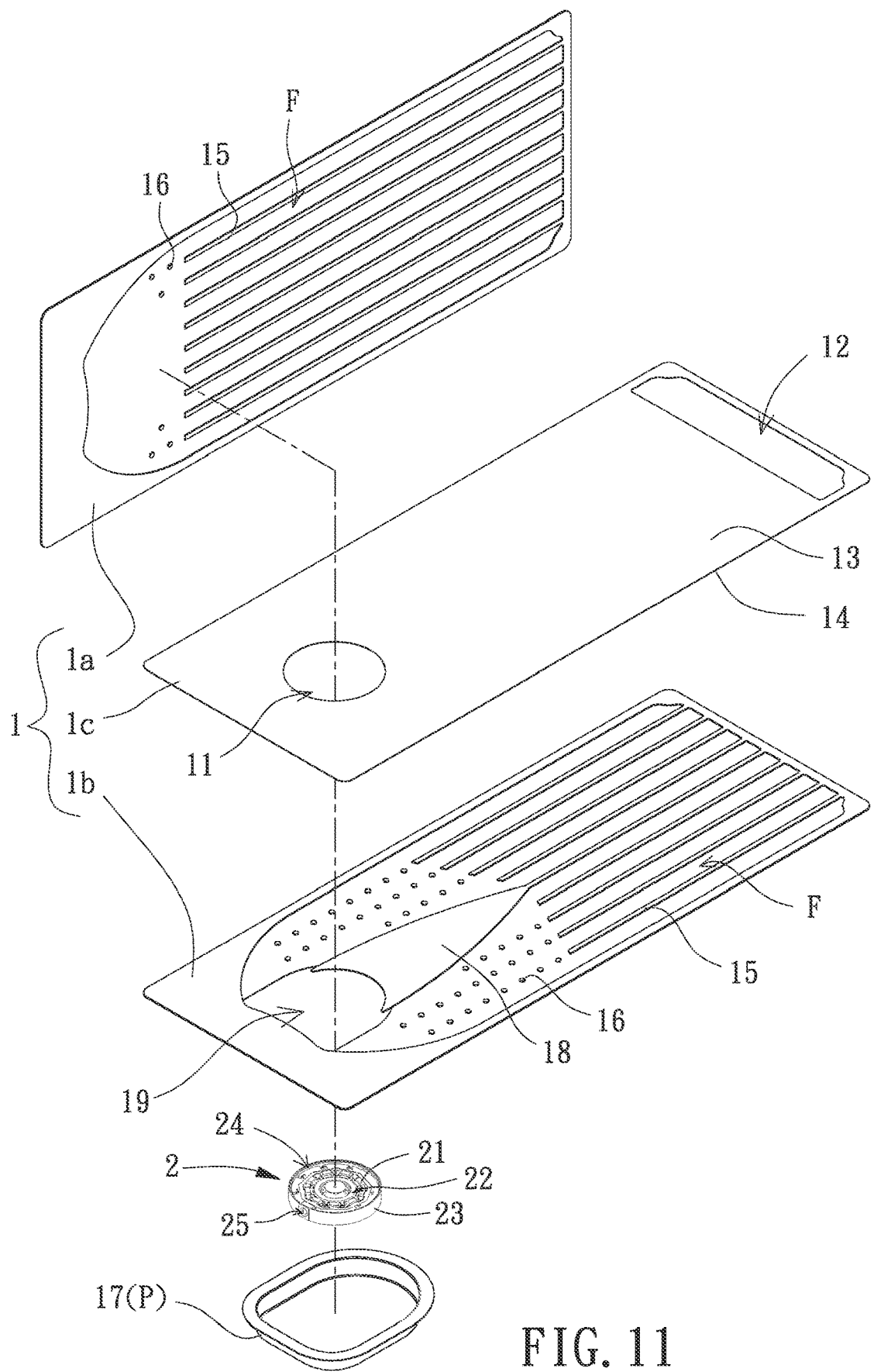
FIG. 11 is an exploded, perspective view illustrating a housing of the third embodiment cooperating with a pump of the first embodiment according to the present invention.

It is worth noting that the housing 1 and the pump 2 in each of the above embodiments may be optionally selected to cooperate with each other and should not be limited to the cooperation shown in each embodiment. As an example, FIG. 11 shows cooperation of the housing 1 of the third embodiment and the pump 2 of the first embodiment.

In view of the foregoing, in the liquid cooling module according to the present invention, the first and second chambers and arranged in different layers in the axial direction and intercommunicating with each other can be directly formed in the housing, permitting the working fluid to proceed with large-area circulation, enlarging the heat absorbing area and the cooling area while maintaining excellent circulating efficiency of the working fluid, thereby increasing the cooling efficiency to highly effectively reducing the working temperature of the heat source. Furthermore, the number of components of the liquid cooling module is fewer to reduce the space required for assembly of the components while reliably avoiding leakage of the working fluid resulting from non-sealing assembly between the components. Moreover, the problem of gradual reduction in the amount of working liquid resulting from evaporation is less likely to occur, because the working liquid is not delivered by pipes. In addition, the liquid cooling module can be pre-assembled for subsequent rapid assembly to a pre-determined location of an electronic device. Thus, the liquid cooling module according to the present invention provides increased spatial utilization rate and increased assembly efficiency, which is helpful in development of thinning of electronic devices with the liquid cooling module.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A liquid cooling module comprising:
   a housing including a first chamber and a second chamber, wherein the first chamber and the second chamber are filled with a working fluid, and wherein the first chamber and the second chamber intercommunicate with each other via an intercommunicating port and a backflow port; and
   a pump received in the housing and aligned with the intercommunicating port, wherein the pump includes a stator driving an impeller to rotate, driving the working fluid to flow from the first chamber through the intercommunicating port, the stator, and the impeller, wherein the working fluid flows through the second chamber back into the first chamber via the backflow port,
   wherein the housing includes a first board, a second board, and a partitioning board between the first board and the second board, wherein the first chamber is located between the first board and the partitioning board, wherein the second chamber is located between the second board and the partitioning board, and wherein the intercommunicating port and the backflow port are disposed on the partitioning board.

2. The liquid cooling module as claimed in claim 1, wherein the partitioning board includes a first face and a second face opposite to the first face, wherein the first board is coupled to the first face of the partitioning board by laser welding, and wherein the second board is coupled to the second face of the partitioning board by laser welding.

3. The liquid cooling module as claimed in claim 1, wherein the second board includes a bulge, and wherein the pump is at least partially received in the bulge.

4. The liquid cooling module as claimed in claim 3, wherein the bulge is integrally formed with a remaining portion of the second board.

5. The liquid cooling module as claimed in claim 3, wherein the second board includes a through-hole, wherein a cap is coupled to the second board and is aligned with the through-hole, and wherein the cap forms the bulge of the second board.

6. The liquid cooling module as claimed in claim 3, wherein the pump is coupled to the partitioning board by the stator, wherein a portion of the stator surrounding the intercommunicating port forms a liquid inlet of the pump, wherein a shaft coupling portion is disposed in the bulge, and wherein the impeller is rotatably coupled to the shaft coupling portion.

7. The liquid cooling module as claimed in claim 1, wherein the pump includes a seat, wherein the seat is coupled to the partitioning board by an annular wall and forms a liquid inlet of the pump at a location contiguous to the intercommunicating port, and wherein the pump has a liquid outlet disposed on the annular wall.

8. The liquid cooling module as claimed in claim 7, wherein the annular wall is coupled to the partitioning board by laser welding.

9. The liquid cooling module as claimed in claim 7, wherein the stator includes a winding portion disposed on an inner periphery of an outer ring, wherein the outer ring is coupled to the seat, wherein the impeller includes a plurality of blades surrounding a hub, wherein a magnetic member is disposed on the hub, wherein the seat includes a bottom board connected to the annular wall, wherein the liquid inlet of the pump is aligned with the bottom board, wherein a shaft coupling portion is disposed on the bottom board and is located in the seat, wherein the hub is rotatably coupled to the shaft coupling portion, and wherein the magnetic member is aligned with the winding portion.

10. The liquid cooling module as claimed in claim 7, wherein the liquid outlet of the pump faces away from the backflow port, wherein the housing includes an island located in the second chamber, and wherein the island is contiguous to the intercommunicating port and extends towards the backflow port.

11. The liquid cooling module as claimed in claim 7, wherein a diameter of the liquid inlet is larger or equal to a minimal inner diameter of the stator and is smaller than or equal to an outer diameter of the annular wall.

12. The liquid cooling module as claimed in claim 1, wherein the housing includes a plurality of ribs spaced from each other and located in the first chamber and the second chamber, and wherein a fluid passage is formed between each two adjacent ribs.

13. The liquid cooling module as claimed in claim 12, wherein the plurality of ribs does not extend to a portion of the first chamber surrounding the intercommunicating port and a portion of the second chamber surrounding the intercommunicating port.

14. The liquid cooling module as claimed in claim 1, wherein the stator and the impeller are disposed on a same side of the partitioning board.

15. The liquid cooling module as claimed in claim 1, wherein the first chamber and the second chamber of the housing are formed by etching.

16. The liquid cooling module as claimed in claim 1, wherein the working fluid is an electrically non-conductive liquid.

17. An electronic device comprising:
a casing;
an electric module received in the casing and including a heat generating area; and
the liquid cooling module set forth in claim 1, wherein the liquid cooling module is disposed in the casing and is in thermal connection with the heat generating area via a heat absorbing zone of the housing aligned with the first chamber or the second chamber.

* * * * *